United States Patent [19]

Gottlieb

[11] Patent Number: 4,511,951
[45] Date of Patent: Apr. 16, 1985

[54] MULTILAYER DECOUPLING CAPACITOR AND METHOD OF MANUFACTURE THEREOF

[75] Inventor: Michael M. Gottlieb, Kraainem, Belgium

[73] Assignee: Rogers Corporation, Rogers, Conn.

[21] Appl. No.: 551,576

[22] Filed: Nov. 14, 1983

[51] Int. Cl.³ .................... H01G 9/00; H01G 7/00
[52] U.S. Cl. .................................. 361/433; 29/25.42
[58] Field of Search ............... 29/25.42; 174/72 B; 361/321, 322, 433, 392, 393, 402, 404, 306

[56] References Cited

U.S. PATENT DOCUMENTS

| | | | |
|---|---|---|---|
| 3,550,228 | 12/1970 | Asscher | 29/25.42 |
| 3,588,629 | 6/1971 | Millard et al. | 361/433 |
| 3,880,493 | 4/1975 | Lockhart | 339/147 R |
| 4,236,038 | 11/1980 | Taylor | 361/303 X |
| 4,266,091 | 5/1981 | Fukuda | 174/72 B |
| 4,356,532 | 10/1982 | Donaher et al. | 361/393 |
| 4,394,713 | 7/1983 | Yoshida | 361/433 |

FOREIGN PATENT DOCUMENTS 5141864 10/1974 Japan.
58-20556 2/1983 Japan.

*Primary Examiner*—Donald A. Griffin
*Attorney, Agent, or Firm*—Fishman & Dionne

[57] ABSTRACT

A decoupling capacitor and method of manufacture thereof are presented wherein the decoupling capacitor is formed in an in-line assembly and insert molding process. The decoupling capacitor is a hermetically sealed capacitive unit consisting of a ceramic multilayer chip, active leads and molded lugs for auto-insertion into printed circuit boards.

24 Claims, 5 Drawing Figures

MULTILAYER DECOUPLING CAPACITOR AND METHOD OF MANUFACTURE THEREOF

BACKGROUND OF THE INVENTION

This invention relates to the field of decoupling capacitors for integrated circuits. More particularly, this invention relates to novel and improved decoupling capacitors, and methods of formation thereof wherein the capacitors are formed in an automated process of in-line assembly and insert molding to form decoupling capacitors which are auto-insertable into printed circuit boards for use in conjunction with dual-in-line integrated circuits or other electronic components.

U.S. patent application Ser. No. 403,408 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two capacitor leads have been inserted.

The diagonally located leads or pins on the decoupling capacitor of application Ser. No. 403,408 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent terminal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior application Ser. No. 403,408 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

A need also exists for a decoupling capacitor structure which is both auto-insertable, hermetically sealed, and capable of being manufactured by automated assembly processes.

U.S. patent application Ser. No. 456,654 (assigned to the assignee hereof) discloses one approach to solving the above discussed auto-insertion problem by the incorporation of dummy or stabilizing pins in a decoupling capacitor assembly. U.S. patent application Ser. No. 551,466 of Watson for Decoupling Capacitor and Method of Manufacture Thereof and U.S. patent application Ser. No. 552,107 for Improved Decoupling Capacitor of David S. Fishman, both of which are being filed simultaneously herewith and are assigned to the assignee hereof present other constructions of and methods for forming decoupling capacitors with dummy pins or molded stabilizing lugs. The present invention presents other constructions of and methods for forming improved decoupling capacitors which are hermetically sealed, auto-insertable and manufactured in an automated process of in-line assembly and insert molding.

SUMMARY OF THE INVENTION

The above discussed and other problems of the prior art are overcome or substantially reduced by the new and improved decoupling capacitor of the present invention. Also, several additional advantages in design, assembly, cost and quality are realized with the present invention.

In accordance with the present invention, a subassembly of the decoupling capacitor is formed in an automated, in-line assembly process; and the subassembly is then employed, as an insert in an insert molding process to form a hermetically sealed decoupling capacitor.

The in-line assembly process of the present invention results in high speed automated construction of a subassembly for the decoupling capacitor. The subassembly consists of the capacitive ceramic multilayer chip with active leads bonded thereto at opposite ends thereof and carried on a support film. This subassembly is employed as an insert in an insert molding process to produce the final hermetically sealed decoupling capacitor which has dummy lugs integrally formed in the molded housing for auto-insertion purposes. The subassembly is formed in an in-line strip process employing a continuous band of a suitable metal alloy. Connection plates and active leads are punched in the metal band or strip; the capacitive chips and the connector plates are tacked to a support film and the plates are edge bonded conductive ends of the capacitor to form the subassembly; and the subassembly is then insert molded.

The assembly process may be carried out in a continuous process or in a series of discontinuous groups of steps. Also, a strip of subassemblies may be used as inserts in a multi-station transfer mold, whereby a plurality of the decoupling capacitors may be formed in each insert molding step.

In addition to solving the misalignment problem and being suitable for auto-insertion, the decoupling capacitor of the present invention and the process of formation thereof have several other advantages and potentials. The decoupling capacitor of the present invention is hermetically sealed in the insert molding step, thereby sealing the capacitor elements from environmental hazards. The process of the present invention is particularly suitable for high speed production of the decoupling capacitors in large quantities, with a minimum number of components being required to make the product, and this process presents opportunities for reduced costs along with overall improvement in quality.

Another feature and advantage of the present invention is that the terminal pins project from the sides of the body at approximately the same height or level even though being electrically connected to opposite sides or faces of the capacitor. This feature enhances the uniformity and symmetry of the product and may contribute to increased stability in handling during auto-insertion.

The above discussed and other advantages of the present invention will be apparent to and understood by those skilled in the art from the following detailed description and drawings.

BRIEF DESCRIPTION OF THE DRAWINGS

Referring now to the several Figures of the drawings, wherein like elements are numbered alike in the several Figures.

DESCRIPTION OF THE PREFERRED EMBODIMENTS

Figure 1:
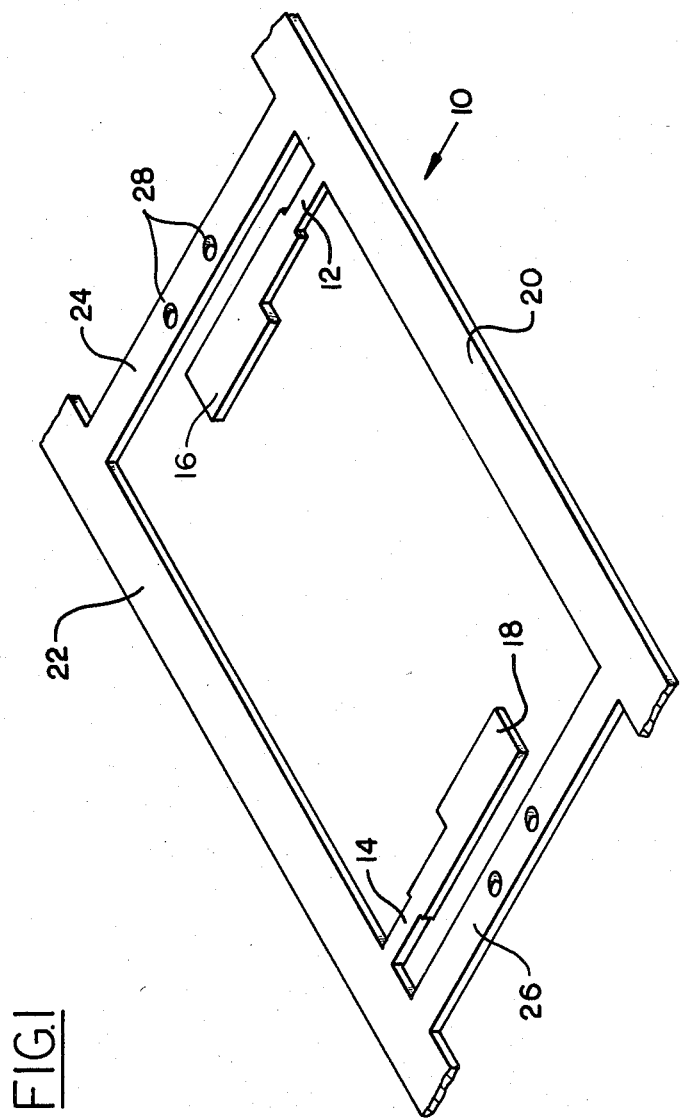
FIG. 1 is a perspective view of a first stage of subassembly components and construction of the capacitive element in accordance with the present invention.
Figure 5:
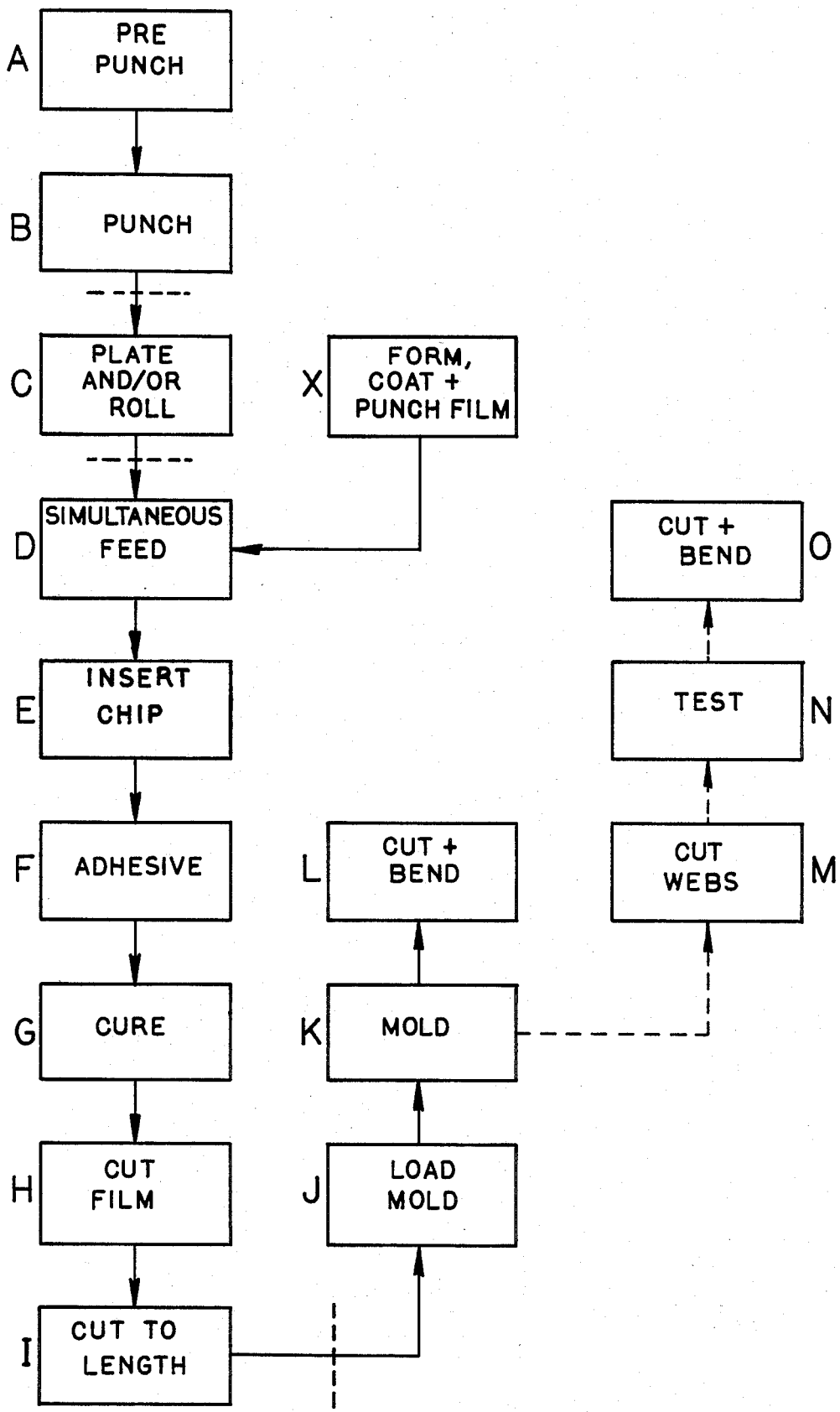
FIG. 5 is a block flow diagram of the manufacturing process in accordance with the present invention.

Referring to a joint consideration of FIGS. 1 and 5, subassembly components are punched from a continuous strip or band of metal, such as copper alloy, of 0.25 mm thick and of suitable width for the requirements of the component being made. A portion of the continuous copper band is shown in FIG. 1 after various punching steps have been performed to form a band of windows 10 which in their open interiors have the basic form of contact pins 12 and 14 and connection plates 16 and 18. The exterior or perimeter of each window 10 is made up of a pair of edge strips 20 and 22 and transverse connecting webs 24 and 26 which remain after the punching operations have taken place to form the structure within the windows.

The structure of FIG. 1 is formed from the continuous band of copper in a series of process steps indicated as steps A and B in FIG. 5. In step A, a preliminary punching step is performed whereby relief holds or windows are punched to remove parts of the unwanted areas from within the interior of the window frame. The strip of material then advances to the next stage of the punching tool wherein material is removed to form the array of terminal contact pins 12 and 14 and connection plates 16 and 18 within the window as shown in FIG. 1 in process step B. In this process step B, locating or alignment holes 28 are also punched into the continuous copper band for alignment and registration purposes in further process steps.

It will be noted that the tooling which accomplishes the punching can be so designed that the distance between the center of the terminal pins 12 and 14 and the size of the connection plates 16 and 18 may be varied to accommodate a range of center-to-center distances for the connecting pins and connecting plate sizes in the final product.

Following process step B, the copper band is passed through a tin plating operation so that all metal surfaces are suitably plated. This plating is indicated as process step C in FIG. 5. The plating may be accomplished in a continuous operation immediately following punching step B, or the copper strip may be rewound after punching step B and plated at a subsequent time. Also, either before or after plating step C, the copper strip may be rewound and stored for future use, or it may continue on to the further processing steps of step D, et seq. The fact that step C may be carried out as a continuous part of the process or as an interrupted part of the process is indicated by the dashed lines between steps B and D.

In a separate operation, a thin insulating film 27 (e.g., 50 to 75$\mu$ thick DuPont Mylar) is coated with a very thin (e.g., 5$\mu$ thick) heat activated semi-crosslinkable adhesive, which, after coating will exhibit no tack. This film is then punched with registration holes 29 to coordinate with the registration holes 28 in the copper strip. The insulating film 30 is then wound in a roll to be played out, adhesive surface up, in conjunction with further processing of the copper strip. The forming adhesive coating, registration punching and rolling of film 27 is indicated at step X.

Figure 2:
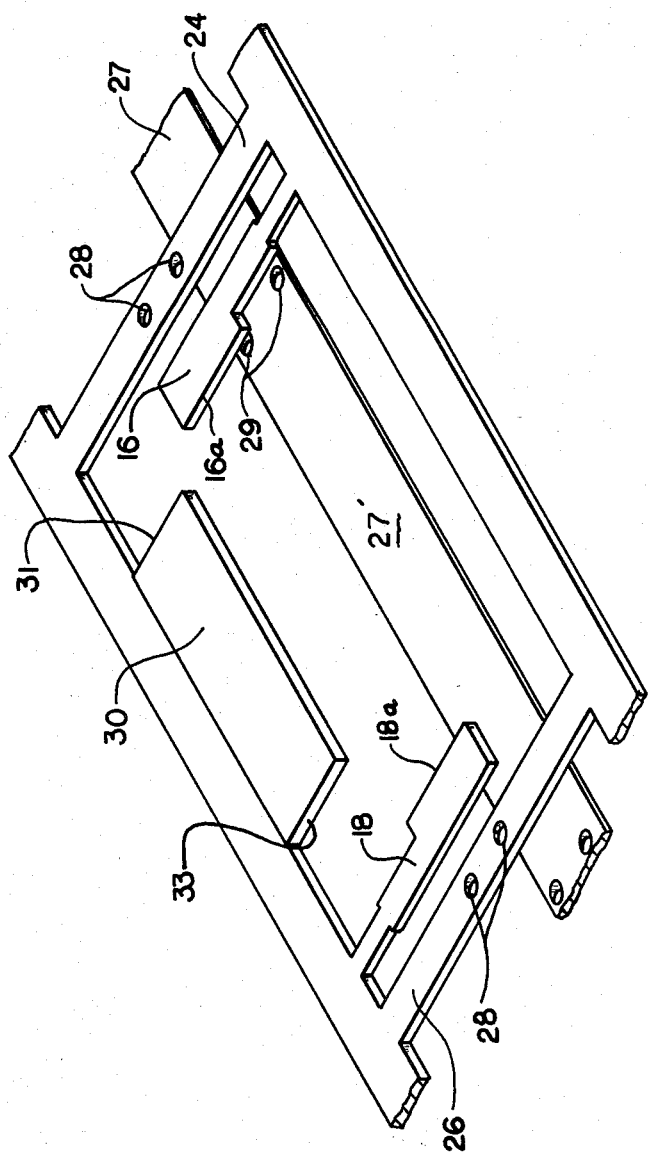
FIG. 2 is a perspective view of a second stage of subassembly components and construction of the capacitive element in accordance with the present invention.
Figure 3:
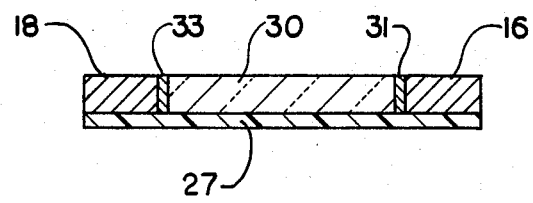
FIG. 3 is a cross-sectional elevation view through a completed subassembly unit in accordance with the embodiment of FIGS. 1 and 2.

Referring now to FIGS. 2 and 5, both the punched copper strip and the insulating film 27 simultaneously are fed into an assembly line which has an advancing system which picks up and registers with both the locating holes 28 in the window frame of the strip and the registration holes 29 in insulating strip 27. The connecting plates 16 and 18 are in contact with the upper adhesively coated surface 27' of the film 27. This simultaneous feed or advancement of the punched copper band and insulating strip is indicated at step D in FIG. 5.

At the first stage in the assembly line, the punched copper band and insulating film strip are stopped, and, in step E, a multilayer capacitive chip 30 is placed on the adhesive surface of the film between the connection plates 16 and 18. Capacitor chip 30 have conductive end surfaces 31 and 33 formed thereon, and this chip 30 is placed on film 27 so that end surfaces 31 are placed adjacent to and almost in contact with the edges 16(a) and 18(a), respectively, of connection plates 16 and 18.

The combination is then advanced to the next station of the assembly process where, in step F, the capacitive element 30 and the connector plate 16 and 18 are heat tacked to film 27 so that the assembly can be easily handled in subsequent operations.

The combination is then advanced to the next station in the assembly line where, in step F, a conductive adhesive is inserted between the conductive end plates 31 and 33 of the capacitor element and the opposed edges 16(a) and 18(a), respectively, of the connection plates.

The capacitive chip inserted into the assembly in step E may, conveniently, be stored in a dispensing magazine for sequential insertion into the assembly. The capacitive chips are formed in a separate operation and consist of a ceramic multilayer capacitor element with conductive end plates (which may be nickel or nickel alloy coated) as disclosed in U.S. patent application Ser. No. 391,967, which is also assigned to the assignee hereof and is incorporated herein by reference).

The combination is then advanced to the next station where, in step G, the conductive adhesive is cured.

The combination is then advanced to the next station where, in step H, the parts of insulating film 27 between the connection plate 16 and web 24 and between connection plate 18 and web 26 are punched out and removed.

Each assembly of a pair of terminal pins 12 and 14 and a pair of connection plates 16 and 18 bonded to a capacitor chip 30 constitutes a subassembly of a decoupling capacitor of the present invention. At this stage in the processing, each subassembly is still attached to the side rails 20 and 22 of the original copper band, and the connecting webs 24 and 26 are still in place.

The band of material then advances to the next station in the assembly operation where the band, in step I, is cut into lengths comprising a desired number of subassemblies in each length. These lengths of subassembly units may then be stored for future use or may be moved directly to further processing steps for insert molding in accordance with the present invention. Once again, the dashed line in the flow diagram following step I indicates that the strips or lengths of subassemblies may be stored for further processing or may pass directly to the further processing steps.

The strip or length of connected subassemblies is next transferred to and charged, in step J, into an appropriately designed multi-station transfer mold (with the number of stations in the mold equalling the number of subassemblies on the strip). Each subassembly constitutes an insert for one station in the transfer mold. The mold is then closed, and in step K, the subassembly is then encapsulated as a molded insert in a suitably selected low pressure epoxy transfer molded plastic. In step K, the entire subassembly of capacitor 30, plates 16 and 18 and terminal pins 12 and 14 is encapsulated with the exception of that portion of pins 12 and 14 which is shown bent down and exposed in FIG. 4 to form a plurality of encapsulated decoupling capacitors as shown in FIG. 4.

Figure 4:
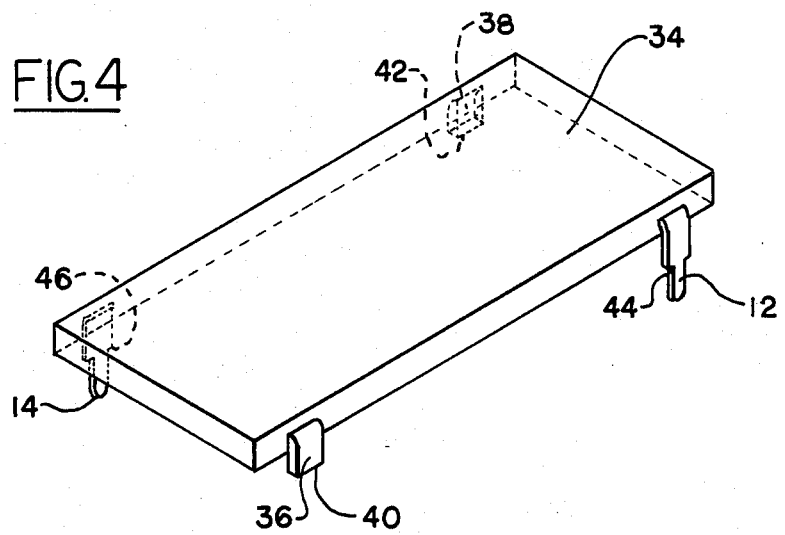
FIG. 4 is a perspective view of a completed decoupling capacitor in accordance with the present invention.

In the next step of the manufacturing process, the strip of molded decoupling capacitor packages is removed from the transfer mold and passed through a suitable punch or cutting tool which, in step L, severs the ends of pins 12 and 14 from edge strips 20 and 22 and bends pins 12 and 14 downwardly from the horizontal position as shown in FIG. 2 to the vertical position shown in FIG. 4. This step separates the individual decoupling capacitors from the strip as a finished product, and the finished product is then ready for testing, marking, burn-in and packaging for storage or shipment.

As an alternative to step L, the transverse webs 24 and 26 may be severed in step M, thus leaving the capacitor elements still connected to edge strips 20 and 22. It is then possible to gang-test, mark and burn-in the capacitors in this strip array in step N, and thereafter sever the pins 12 and 14 from the edge strips 20 and 22 and bend the pins in step O, which corresponds to step L.

As seen in FIG. 4, the final product after molding and severing consists of the encapsulated subassembly, previously described, encapsulated within a plastic outer housing 34. Plastic housing 34 contains integrally molded lugs 36 and 38 which are formed during the molding of package 34 as a result of appropriate recesses in the mold cavity. The final overall shape of the decoupling capacitor is generally rectangular, as shown in FIG. 4. Terminal pins 12 and 14 are located at one pair of diagonally opposite corners of the rectangular structure, and lugs 36 and 38 are located at the other pair of diagonally opposite corners of the unit. Lugs 36 and 38 constitute stabilizing surfaces which provide the necessary symmetry to the assembly for the unit to be gripped by the jaws of an automatic insertion machine for automatic insertion into a printed circuit board. Lugs 36 and 38 are formed so that their exterior contours are the same as the contours of pins 12 and 14 after the pins have been bent. In addition, the bottom surfaces 40 and 42 of the lugs are at the same level as shoulders 44 and 46 on pins 12 and 14. Shoulders 44 and 46 on the terminal pins and the bottom surfaces 40 and 42 of the stablizing lugs cooperate to hold the decoupling capacitor package slightly off the printed circuit board on which it is mounted and absolutely parallel thereto for appropriate cooling and alignment with an integrated circuit to be mounted relative to the decoupling capacitor.

The automated manufacturing process of the present invention results in significant economies in manufacturing the decoupling capacitors hereof. In addition, the end product is hermetically sealed and ruggedly constructed, and it is suitable for use with auto-insertion equipment. Thus, the present invention affords substantial advantages both in its manufacturing process and the end product resulting therefrom.

Another feature and advantage of the present invention is that the terminal pins 12 and 14 project from the sides of body 34 at approximately the same height or level even though being physically and electrically connected to opposite sides or faces of capacitor 30. This feature enhances the uniformity and symmetry of the product and may contribute to increased stability in handling during auto-insertion.

The present invention has been discussed in the general configuration of a decoupling capacitor having axial symmetry, with a pair of diagonally opposed active terminal pins and a pair of diagonally opposed stabilizing lugs. However, it will be understood that this configuration is described for purposes of illustration of the preferred configuration for use with an integrated circuit having diagonally opposed power supply pins; but the present invention is not limited to this configuration. The decoupling capacitor of the present invention can be configured as may be dictated by the configuration and requirements of the integrated circuit or other electronic component with which it is to be used. Thus, for example, if the power supply pins of the integrated circuit are not at diagonally opposed locations, the stabilizing lugs will be located at such other locations, as may be dictated by the location of the power supply pins, to balance the power supply pins; and the number of active pins of the decoupling capacitor may be more than two (to match an IC having more than two power leads); and the number and location of stabilizing lugs need not always be symmetrical with respect to the active pins; all of the above being within the general requirement that the active leads and stabilizing lugs be arranged to provide a balanced array of stabilized engagement sites or surfaces for engagement by the jaws of auto insertion equipment. Also, dummy pins (i.e., pins similar to the active terminal pins but not electrically connected to the capacitive element) may be employed instead of stabilizing lugs.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. The method of making a capacitor, including the steps of:

removing unwanted material from a single strip of electrically conductive material to define a first connection plate and a first terminal pin connected thereto and a second connection plate and a second terminal pin connected thereto;

forming a strip of electrically insulating material with adhesive thereon;

placing said first and second connection plates on one side of said strip of insulating material with said first connection plate being spaced from said second connection plate;

placing a multilayer capacitor element on said one side of said first strip of insulating material between said first and second connection plates, said capacitor element having first and second conductive end surfaces, with said first conductive end surfaces being in electrical contact with said first connection plate and said second conductor end surface being in electrical contact with said second connection plate;

bonding the above elements to form an assembly with said first and second connection plate and said capacitor element bonded to said insulating material and with said first conductive end surface of said capacitor element and said first connection plate being in electrical contact, and with said second conductive end surface of said capacitor element and said second conductive plate being in electrical contact; and encapsulating said assembly to enclose and seal all of said assembly other than other first and second terminal pins.

2. The method of claim 1 including:
   bonding said first and second connector plates to the first and second conductive end surfaces of the capacitor element with conductive adhesive.

3. The method of claim 1 including:
   forming registration holes in said strip of electrically conductive material; and
   forming registration holes in said strip of insulating material.

4. The method of claim 1 wherein:
   said first and second terminal pins are connected to edge strips, said terminal pins being severed from said edge strips after the step of encapsulating.

5. The method of claim 4 including:
   severing said strip of insulating material prior to the step of encapsulating.

6. The method of claim 4 wherein:
   said edge strips are interconnected by transverse webs which cooperate with said edge strips to define a window; and including the step of:
   forming alignment holes in said transverse webs.

7. The method of claim 6 including:
   forming alignment holes in said strip of electrically insulating material.

8. The method of claim 1 wherein:
   said terminal pins are at diagonally opposite locations, and said step of molding includes molding a pair of diagonally opposite stabilizing lugs.

9. The method of making a capacitor, including the steps of:

forming a subassembly of a plurality of capacitor elements by:

(a) removing unwanted material from a single strip of electrically conductive material to define a plurality of pairs of first connection plates with first terminal pins connected thereto and a second connection plate with second terminal pins connected thereto, each of said pairs of first and second terminal pins being connected to edge strips;

(b) forming a strip of electrically insulating material with adhesive material thereon;

(c) placing each of said pairs of first and second connection plates on one side of said strip of insulating material with each of said first connection plates of each pair being spaced from its respective said second connection plate;

(d) placing multilayer capacitor elements on said one side of said strip of insulating material between pairs of said first and second connection plates, each said capacitor element having first and second conductive end surfaces, with the first of said conductive end surfaces being in electrical contact with said first connection plate and the second of said conductive end surfaces being in electrical contact with said second connection plate;

(e) bonding the above elements to form a plurality of subassemblies each having said first and second connection plates and said capacitor element bonded to said insulating material and with said first conductive end surface of said capacitor element and said first connection plate being in electrical contact with said second conductive surface of said capacitor element and said second conductive plate being in electrical contact;

placing the subassemblies formed in (a) through (e) above in a multi-station mold, with each pair of connection plates and the capacitive element associated therewith and the associated portion of said strip of insulating material constituting an insert for a station in the mold;

introducing a molding material into the mold to encapsulate each insert to enclose and seal each insert other than the first and second terminal pins thereof, and define a plurality of encapsulated capacitor elements;

removing the plurality of encapsulated capacitor elements from the mold; and severing the plurality of encapsulated capacitor elements from said edge strips.

10. The method of claim 9 including:
    bonding said first and second connector plates to the first and second conductive end surfaces of the capacitor element with conductive adhesive.

11. The method of claim 9 including:
forming registration holes in said strip of electrically conductive material; and
forming registration holes in said strip of insulating material.

12. The method of claim 9 wherein:
said first and second terminal pins are connected to edge strips, said terminal pins being severed from said edge strips after the step of encapsulating.

13. The method of claim 12 including:
severing said strip of insulating material prior to the step of encapsulating.

14. The method of claim 12 wherein:
said edge strips are interconnected by transverse webs which cooperate with said edge strips to define a window; and including the step of:
forming alignment holes in said transverse webs.

15. The method of claim 14 including:
forming alignment holes in said strip of electrically insulating material.

16. The method of claim 9 wherein:
said terminal pins are at diagonally opposite locations, and said step of molding includes molding a pair of diagonally opposite stabilizing lugs.

17. A decoupling capacitor including:
a first electrically conductive connection plate;
a second electrically conductive connection plate;
a first electrically active terminal pin extending from said first connection plate;
a second electrically active terminal pin extending from said second connection plate;
said first and second electrically active terminal pins being at different positions relative to the decoupling capacitor;
a multilayer capacitive element between said first and second connection plates, said capacitive element having first and second electrically conductive end surfaces;
a layer of electrically insulating material;
said first and second connection plates and said capacitive element being bonded to said layer of insulating material on one side of said layer of insulating material with said first connection plate and said first conductive end surface being electrically connected and said second connection plate and said second conductive end surface being electrically connected;
a molded encapsulating cover encapsulating said connection plates and capacitive element, with said electrically active terminal pins extending from said encapsulating cover at a first pair of positions; and
a pair of electrically inactive stabilizing elements, said stabilizing elements being at a second pair of positions to balance said terminal pins.

18. The capacitor of claim 17 wherein:
said multilayer capacitive element is a ceramic material with a pair of conductive end surfaces.

19. The capacitor of claim 17 wherein:
said electrically inactive stabilizing elements are stabilizing lugs having an exterior contour approximating the exterior contour of at least part of said electrically active terminal pins.

20. The capacitor of claim 17 wherein:
said electrically active terminal pins are at a first pair of diagonally opposed locations and said inactive stabilizing elements are at a second pair of diagonally opposed locations.

21. An array of decoupling capacitors positioned between a pair of edge strips from which connection plates and terminal pins of the capacitors are formed, each of said decoupling capacitors having;
a first electrically conductive connection plate;
a second electrically conductive connection plate;
a first electrically active terminal pin extending from said first connection plate;
a second electrically active terminal pin extending from said second connection plate;
said first and second electrically active terminal pins being at different positions relative to the decoupling capacitor;
a multilayer capacitive element between said first and second connection plates, said capacitive element having first and second electrically conductive end surfaces;
a layer of electrically insulating material;
said first and second connection plates and said capacitive element being bonded to said layer of insulating material on one side of said layer of insulating material with said first connection plate and said first conductive end surface being electrically connected and said second connection plate and said second conductive end surface being electrically connected;
a molded encapsulating cover encapsulating said connection plates and capacitive element, with said electrically active terminal pins extending from said encapsulating cover at a first pair of positions; and
a pair of electrically inactive stabilizing elements, said stabilizing elements being at a second pair of positions to balance said terminal pins.

22. The capacitor of claim 21 wherein:
said multilayer capacitive element is a ceramic material with a pair of conductive end surfaces.

23. The capacitor of claim 21 wherein:
said electrically inactive stabilizing elements are stabilizing lugs having an exterior contour approximating the exterior contour of at least part of said electrically active terminal pins.

24. The capacitor of claim 21 wherein:
said electrically active terminal pins are at a first pair of diagonally opposed locations and said inactive stabilizing elements are at a second pair of diagonally opposed locations.

* * * * *